US009665683B1

(12) United States Patent
Schumacher et al.

(10) Patent No.: US 9,665,683 B1
(45) Date of Patent: May 30, 2017

(54) DESIGNING A SYSTEM FOR A PROGRAMMABLE SYSTEM-ON-CHIP USING PERFORMANCE CHARACTERIZATION TECHNIQUES

(71) Applicant: Xilinx, Inc., San Jose, CA (US)

(72) Inventors: Paul R. Schumacher, Berthoud, CO (US); Graham F. Schelle, Longmont, CO (US); Patrick Lysaght, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/921,674

(22) Filed: Oct. 23, 2015

(51) Int. Cl.
*G06F 17/50* (2006.01)
*G06F 9/455* (2006.01)

(52) U.S. Cl.
CPC ................. *G06F 17/5081* (2013.01)

(58) Field of Classification Search
CPC .................................................. G06F 17/5081
USPC .......................................................... 716/132
See application file for complete search history.

(56) References Cited

U.S. PATENT DOCUMENTS

| 8,667,439 B1 * | 3/2014 | Kumar ................ G06F 17/5031 716/106 |
| 9,081,925 B1 * | 7/2015 | Schumacher ....... G06F 17/5022 |
| 9,294,354 B2 * | 3/2016 | Kumar ................ G06F 17/5068 |
| 2015/0032437 A1 * | 1/2015 | Kumar ................ G06F 17/5009 703/14 |
| 2015/0117261 A1 * | 4/2015 | Kumar ................ G06F 17/5068 370/255 |

OTHER PUBLICATIONS

U.S. Appl. No. 13/676,035, Schumacher, Paul R. et al., filed Nov. 13, 2012, San Jose, CA USA.

* cited by examiner

*Primary Examiner* — Suresh Memula
(74) *Attorney, Agent, or Firm* — Robert M. Brush; Keith Taboada

(57) ABSTRACT

An example method of implementing a system design for a programmable system-on-chip (SOC) having a processing system and programmable logic includes receiving a description of performance objectives for the system design. The method further includes accessing a characterization database that relates parameter settings of the processing system to performance under different traffic profiles as generated by an emulation system comprising the processing system and one or more circuit blocks implemented in the programmable logic. The method further includes obtaining a parameter set from the characterization database based on the description of the performance objectives. The method further includes generating a parameter image for setting registers of the processing system based on the parameter set.

20 Claims, 6 Drawing Sheets

DESIGNING A SYSTEM FOR A PROGRAMMABLE SYSTEM-ON-CHIP USING PERFORMANCE CHARACTERIZATION TECHNIQUES

TECHNICAL FIELD

Examples of the present disclosure generally relate to electronic system design and, in particular, to designing systems for programmable system-on-chips (SoCs) using performance characterization techniques.

BACKGROUND

Estimating the likely performance of a system is an important part of the design process. A variety of performance estimation tools are available for system designers of application specific integrated circuits (ASICs). Similarly, a variety of different performance estimation tools are available for developing purely software-based systems. Whether hardware-based or software-based, the approach taken by most performance estimation tools is to add monitor functionality to existing designs. This approach necessarily infers that the complete design for which performance estimation is desired, whether hardware or software, is fully realized. The necessity of having a fully realized design makes make performance estimation tools unusable in the early stages of system design when many architectural decisions are made.

SUMMARY

Techniques for designing a system for a programmable SOC using performance characterization techniques are described. In an example, a method of implementing a system design for a programmable system-on-chip (SOC) having a processing system and programmable logic includes receiving a description of performance objectives for the system design. The method further includes accessing a characterization database that relates parameter settings of the processing system to performance under different traffic profiles as generated by an emulation system comprising the processing system and one or more circuit blocks implemented in the programmable logic. The method further includes obtaining a parameter set from the characterization database based on the description of the performance objectives. The method further includes generating a parameter image for setting registers of the processing system based on the parameter set.

In another example, a method of implementing a system design for a programmable system-on-chip (SOC) having a processing system and programmable logic includes receiving an initial parameter set for the processing system and an expected traffic profile. The method further includes accessing a characterization database that relates parameter settings of the processing system to performance under different traffic profiles as generated by an emulation system comprising the processing system and one or more circuit blocks implemented in the programmable logic. The method further includes obtaining performance data from the characterization database based on the initial parameter set and the expected traffic profile. The method further includes generating an updated parameter image for setting registers of the processing system based on the performance data.

In another example, a computer system includes a memory storing program code, and a processor, coupled to the memory, configured to execute the program code to: receive a description of performance objectives for the system design; access a characterization database that relates parameter settings of the processing system to performance under different traffic profiles as generated by an emulation system comprising the processing system and one or more circuit blocks implemented in the programmable logic; obtain a parameter set from the characterization database based on the description of the performance objectives; and generate a parameter image for setting registers of the processing system based on the parameter set.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
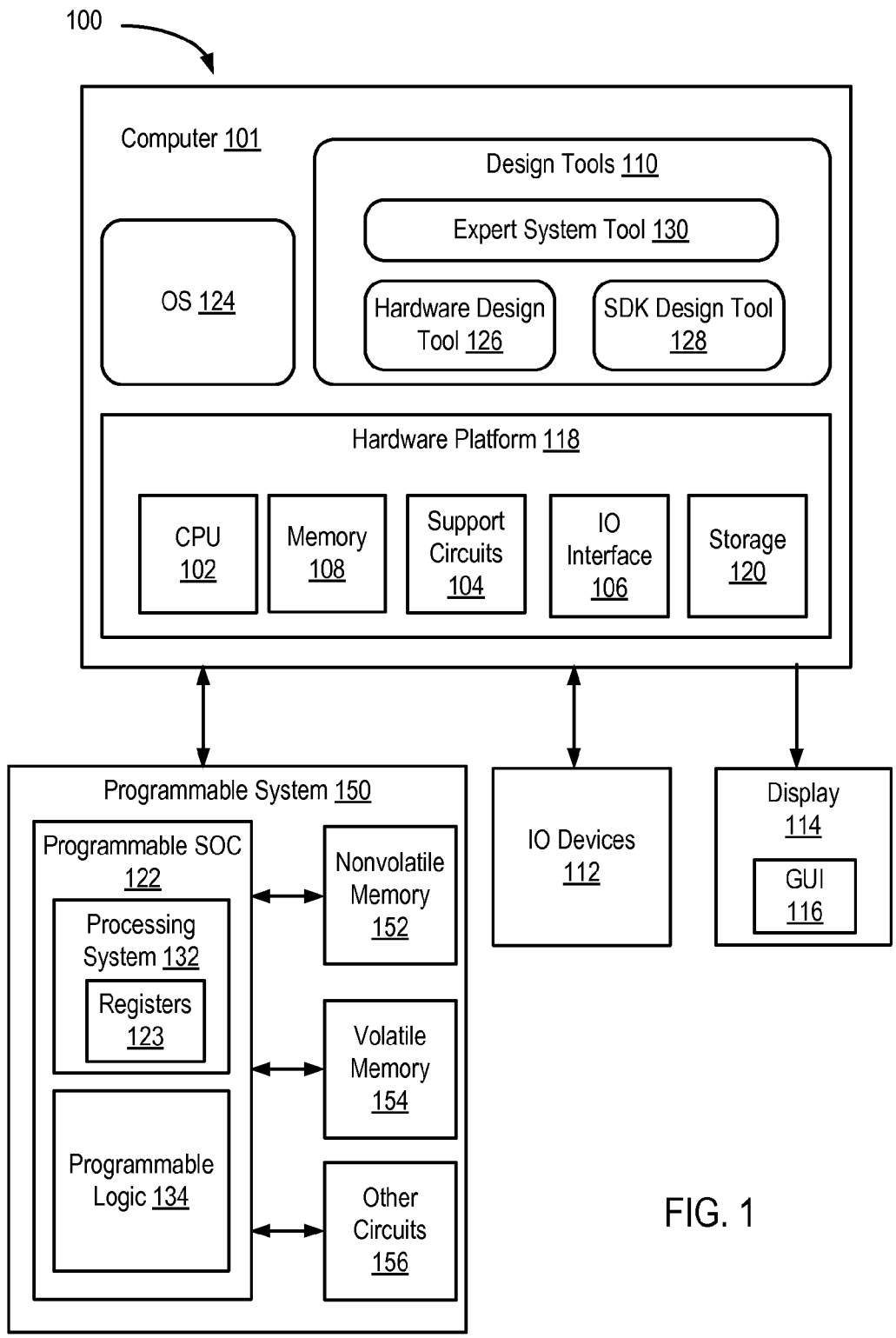
FIG. 1 is a block diagram depicting an example of a design system.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated, or if not so explicitly described.

Techniques for implementing a system design for a programmable SOC having a processing system and programmable logic are described. In an example, an expert system tool is provided that receives a description of performance objectives for the system design from a designer. The expert system tool accesses a characterization database that relates parameter settings of the processing system to performance under different traffic profiles. The performance data is generated by an emulation system comprising the processing system and one or more circuit blocks implemented in the programmable logic. The expert system tool obtains a parameter set from the characterization database based on the description of the performance objectives. The expert system tool generates a parameter image for setting registers of the processing system based on the parameter set. The expert system tool can then output the parameter image, or use the parameter image to generate a boot loader and/or system image for programming the programmable SOC. The expert system tool obviates the need for the designer to have an understanding of the many thousands of registers that configure the processing system. These and further aspects are described below with respect to the following figures.

FIG. 1 is a block diagram depicting an example of a design system 100. The design system 100 includes a computer 101 coupled to a programmable system 150, input/output (IO) devices 112, and a display 114. The programmable system 150 can be a circuit board comprising a programmable system-on-chip (SOC) 122. The programmable system 150 can further include nonvolatile memory 152 (e.g., FLASH memory or the like), volatile memory 154 (e.g., dynamic random access memory (DRAM) or the like), and other circuits 156 (e.g., clock generators, voltage regulators, and the like).

The programmable SOC 122 can be an integrated circuit (IC) comprising a processing system 132 and programmable logic 134. The programmable logic 134 includes programmable circuit elements within an integrated circuit (IC), e.g., the various programmable or configurable circuit blocks or tiles described herein, as well as interconnect circuitry that selectively couples the various circuit blocks, tiles, and/or elements according to configuration data that is loaded into the IC. In general, the functionality of programmable logic 134 is not established unit a configuration data is loaded into the IC. A set of configuration bits can be used to program the programmable logic 134. The configuration bits are typically referred to as a "configuration bitstream." In general, the programmable logic 134 is not operational or functional without first loading a configuration bitstream into the IC. The configuration bitstream effectively implements or instantiates a circuit design within the programmable logic 134. The circuit design specifies, for example, functional aspects of the programmable circuit blocks and physical connectivity among the various programmable circuit blocks.

The processing system 132 comprises hardwired circuitry. Circuitry that is "hardwired" or "hardened" is manufactured as part of the IC. Unlike programmable logic, hardwired circuitry is not programmed with functionality after the manufacture of the IC through the loading of a configuration bitstream. Hardwired circuitry is generally considered to have dedicated circuit blocks and interconnects, for example, which have a particular functionality and are functional without first loading a configuration bitstream into the IC. Hardwired circuitry can have one or more operational modes (as opposed to functionality) that can be set or selected according to parameter settings. The parameter settings can be realized, for example, by storing values in one or more memory elements within the IC (e.g., registers 123). The operational modes can be set, for example, through the loading of the configuration bitstream into the programmable SOC 122. Despite this ability, the hardwired circuitry is not considered to be "programmable logic", as the hardwired circuitry is operable and has a particular function when manufactured as part of the IC.

The computer 101 includes a hardware platform 118, which can include conventional components of a computing device, such as a central processing unit (CPU) 102, system memory 108, various support circuits 104, storage 120, and an IO interface 106. The CPU 102 can include one or more microprocessors. The CPU 102 is configured to execute instructions that perform one or more operations described herein. The instructions can be stored in system memory 108, storage 120, or any other memory in the hardware platform 118 (e.g., cache memory). The system memory 108 includes devices that store information and can include, for example, random access memory (RAM), read-only memory (ROM), or a combination thereof. The storage 120 includes local storage devices, such as hard disks, flash memory modules, solid state disks, optical disks, and the like. The storage 120 can also include interface(s) configured for communication with one or more network data storage systems. The support circuits 104 can include conventional cache, power supplies, clock circuits, data registers, IO interfaces, and the like. The IO interface 106 includes conventional interfaces to the computer 101 known in the art. The IO interface 106 can be coupled to the IO devices 112, which can include conventional keyboard, mouse, and the like. The IO interface 106 can also be coupled to the display 114, which can present a GUI 116 to a user.

The computer 101 further includes a software platform comprising an operating system (OS) 124 and design tools 110. The OS 124 and the design tools 110 include instructions that are executed by the CPU 102. The OS 124 can include any known operating system, such as Linux®, Microsoft Windows®, Mac OS®, and the like. The design tools 110 include applications that execute within the OS 124, which provides an interface to the hardware platform 118. The design tools 110 can include various applications, such as a hardware design tool 126 and a software development kit (SDK) design tool 128. The hardware design tool 126 can be used to configure hardware of the programmable SOC 122. The SDK design tool 128 can be used to develop software for execution on the programmable SOC 122. In general, a system designer can use the design tools 110 to specify an electronic system for implementation in the programmable SOC 122. The electronic system can include processor(s) executing program code that interact with circuit(s). The design tools 110 can implement the circuit(s) within the programmable logic 134 and target the program code for execution within the processing system 132. The design tools 110 can generate a system image for the programmable system 150, which can include one or more configuration bitstreams for configuring the programmable SOC 122 and program code for execution by the processing system 132. The program code can include one or more bootloaders, one or more operating systems, one or more applications, data, and the like.

The design tools 110 can further include an expert system tool 130. The expert system tool 130 can guide a system designer in selecting optimal parameter settings for the processing system 132 based on desired performance requirements. The processing system 132 can include a large number of parameter settings, such as a large number of configurable registers 123. For example, the processing system 132 can include thousands or even tens of thousands of registers 123, each having one or more fields. It can be difficult for a system designer to identify a combination of parameter settings that achieves optimal performance for a particular system. Typically, a system designer must iteratively investigate a myriad of parameter setting combinations during system design. Keeping track of which parameters are available, how each parameter affects the system performance, and how each parameter interacts (or even conflicts) with each other can be a daunting task. The expert system tool 130 solves these issues. The expert system tool 130 can be used to characterize a specific target SOC platform, such as the programmable SOC 122. The expert system tool 130 can be used to sweep and characterize the programmable SOC 122 to create a characterization database that relates parameter settings with performance results. The expert system tool 130 can then use the characterization database to provide a system designer suggested parameter settings that provide optimal performance for a system design.

Figure 2:
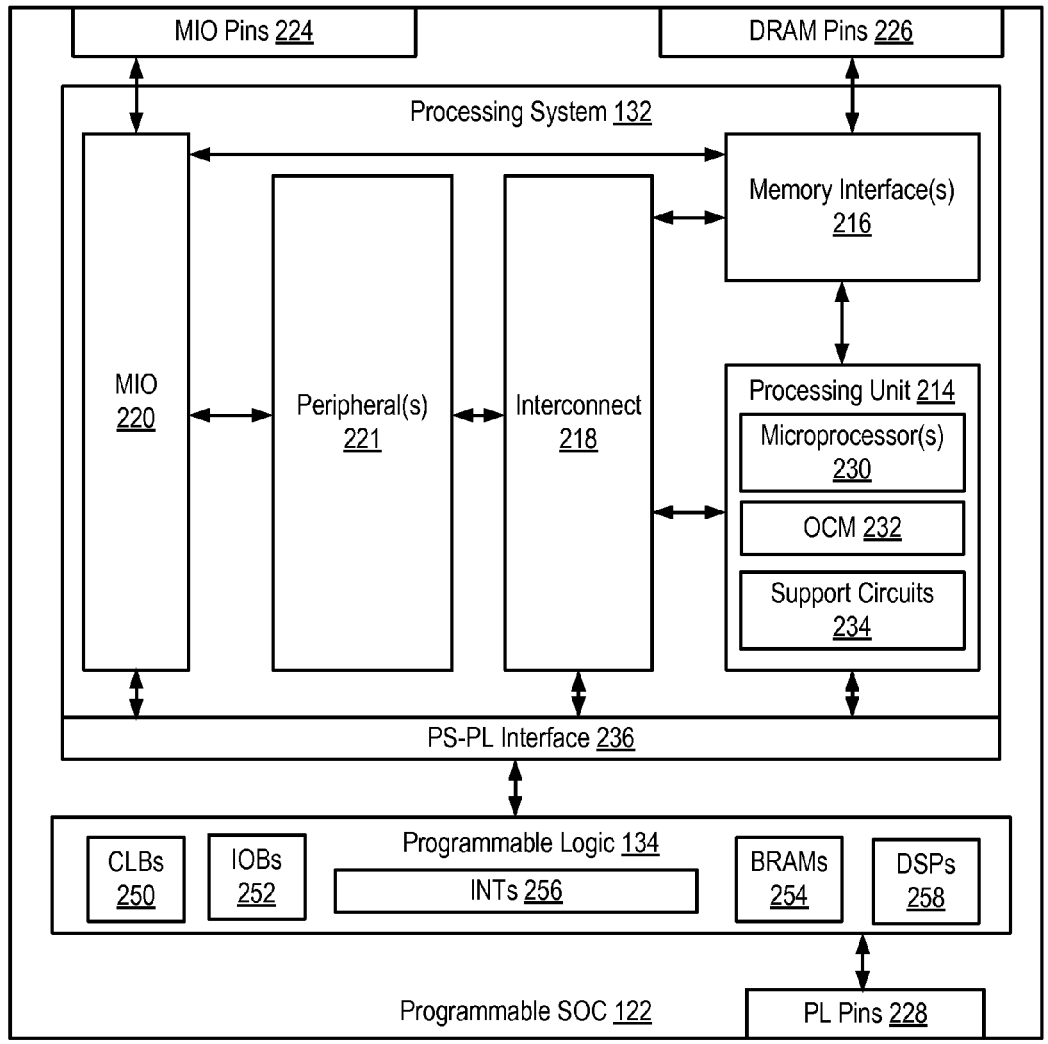
FIG. 2 is a block diagram depicting an example programmable system-on-chip (SOC).

FIG. 2 is a block diagram depicting an example of the programmable SOC 122. The programmable SOC 122 includes a processing system 132 (also referred to as PS 132) and programmable logic 134 (also referred to as PL 134). The programmable SOC 122 can integrate a microprocessor-based processing system with programmable logic of a field programmable gate array (FPGA), complex programmable logic device (CPLD), or the like. The processing system 132 can be coupled to various input/output (IO) pins of the programmable SOC 122, including multiplexed IO (MIO) pins 224 and dynamic random access memory (DRAM) pins 226. The programmable logic 134 can be coupled to programmable logic (PL) pins 228.

The processing system 132 can include a processing unit 214, one or more memory interfaces (memory interface(s) 216), interconnect 218, one or more peripherals (peripheral(s) 221), an MIO circuit (MIO 220), and a PS-PL interface 236, among other components. The processing unit 214 can be coupled to the memory interface(s) 216. The memory interface(s) 216 can include DRAM memory controllers, non-volatile memory controllers, and the like. The memory interface(s) 216 can be coupled to the DRAM pins 226 to communicate with the DRAM 204 (e.g., system memory for the processing system 132). The processing unit 214, the memory interface(s) 216, and the peripheral(s) 221 can be coupled to the interconnect 218. The interconnect 218 can include busses, switches, ports, and the like to facilitate connection between components of the processing system 132.

The peripheral(s) 221 and the memory interface(s) 216 can also be coupled to the MIO 220, which is in turn coupled to the MIO pins 224. The peripheral(s) 221 can communicate with other circuits through the MIO 220. The MIO 220 multiplexes interfaces of the peripheral(s) 221 and the memory interface(s) 216 among the MIO pins 224. The peripheral(s) 221, MIO 220, the interconnect 218, and the processing unit 214 can be coupled to the PS-PL interface 236 for communicating with the programmable logic 134.

The processing unit 214 includes one or more microprocessors (microprocessor(s) 230), on-chip memory (OCM) 232, and support circuits 234. The microprocessor(s) 230 can include any type of microprocessors known in the art. The OCM 232 can include cache memory, local memory, or the like. The support circuits 234 can include various types of circuits, such as interrupt controller(s), direct memory access (DMA) controllers, timers, registers, interconnect, cache controllers, and the like.

The processing system 132 is coupled to the programmable logic 134 through the PS-PL interface 236. The programmable logic 134 can communicate with the processing unit 214, the memory interface(s) 216, the MIO 220, and the peripheral(s) 221 of the processing system 132. For example, the programmable logic 134 can interrupt the processing unit 214, access memory through the memory interface(s) 216 or within the processing unit 214, and access the peripheral(s) 221.

The programmable logic 134 can include a large number of different programmable tiles including, configurable logic blocks ("CLBs") 250, random access memory blocks ("BRAMs") 254, input/output blocks ("IOBs") 252, digital signal processing blocks ("DSPs") 258, and other programmable logic, such as digital clock managers, analog-to-digital converters, system monitoring logic, multi-gigabit transceivers ("MGTs"), configuration and clocking logic, specialized input/output blocks (e.g., configuration ports and clock ports), processor blocks, and so forth. The programmable logic 134 also includes programmable interconnect elements (INTs 256) that provide a programmable interconnect structure between the various blocks.

The registers 123 (not explicitly shown in FIG. 2) can be distributed throughout the processing system 132. The registers 123 store parameters of the processing system 132 that are set to control various parts of the processing system 132, such the processing unit 214, the memory interfaces 216, the interconnect 218, the peripherals 221, the MIO 220, and the PS-PL interface 236. Some of the registers 123 are only programmable at reset of the processing system 132 (referred to as the "static register set"). The remainder of the registers 123 (referred to as the "dynamic register set") can be configured after reset.

Figure 3:
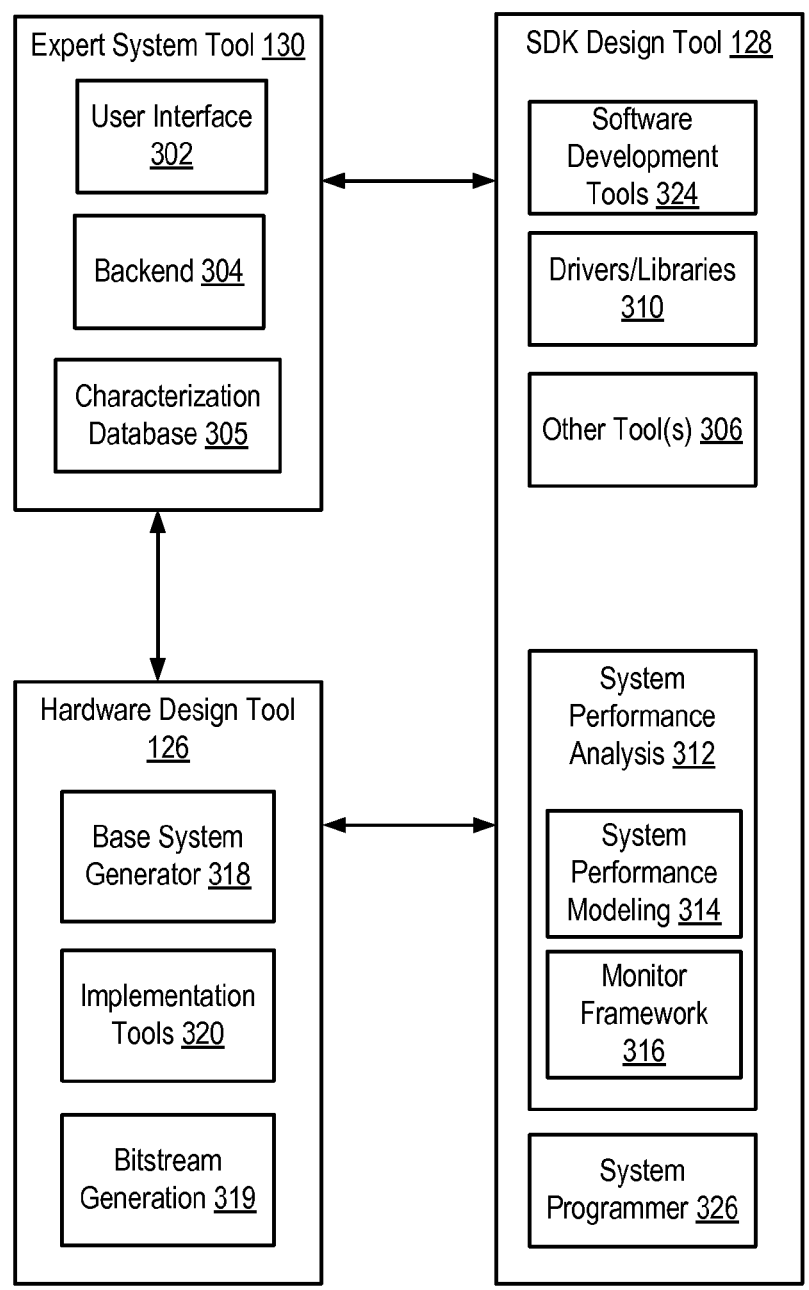
FIG. 3 is a block diagram depicting example design tools.

FIG. 3 is a block diagram depicting an example of the design tools 110. As described above, the design tools 110 include the expert system tool 130, the SDK design tool 128, and the hardware design tool 126. Each of the expert system tool 130, the SDK design tool 128, and the hardware design tool 126 can include one or more components as illustrated in FIG. 3. The expert system tool 130 can include a user interface 302, a backend 304, and a characterization database 305. The SDK design tool 128 can include software development tools 324 (e.g., various compilers, linkers, etc.), drivers/libraries 310, a system performance analysis (SPA) component 312, and a system programmer component 326. The SDK design tool 128 can include one or more other tools 306, such as software profiling tools, a system debugger, and the like. The SPA component 312 component can include system performance modeling (SPM) component 314 and a monitor framework 316. The hardware design tool 126 can include a base system generator 318, implementation tools 320, and a bitstream generation component 319.

A designer can use the hardware design tool 126 to design the hardware platform of the electronic system to be implemented in the programmable SOC 122. The hardware platform of the electronic system can include one or more processors, volatile and/or nonvolatile memory within the programmable SOC 122, volatile and/or nonvolatile memory external to the programmable SOC 122, peripherals, and other custom circuits to be implemented in programmable logic. The base system generator 318 can be used to generate a base hardware platform for the electronic system. The base system generator 318 provides a hardware platform specification as output. The hardware platform specification describes the system elements, such as processor types, debug interfaces, cache configuration, memory types and sizes, peripherals and the like. The hardware platform specification can include parameter settings for the processing system 132 that implement the base hardware platform. The implementation tools 320 can include synthesis, map, place-and-route, and the like tools, and can be used to implement hardware (e.g., custom circuits) for a target programmable SOC. The bitstream generation component 319 can generate a configuration bitstream to be loaded into the programmable SOC 122.

A designer can use the SDK design tool 128 to develop software of the electronic system to be implemented in the programmable SOC 122. The software can include program code to be executed on one or more processors in the programmable SOC 122 (e.g., one or more processors in the processing system). A designer can use the software development tools 324 and the drivers/libraries 310 to develop the software. A designer can use the SPA component 312 to analyze performance of the electronic system, as described further below. The system programmer component 326 can be used to load a system image to the programmable system 150. The system image can include configuration bitstreams, bootloaders, applications, operating systems, data, and the like for the programmable SOC 122.

Figure 4:
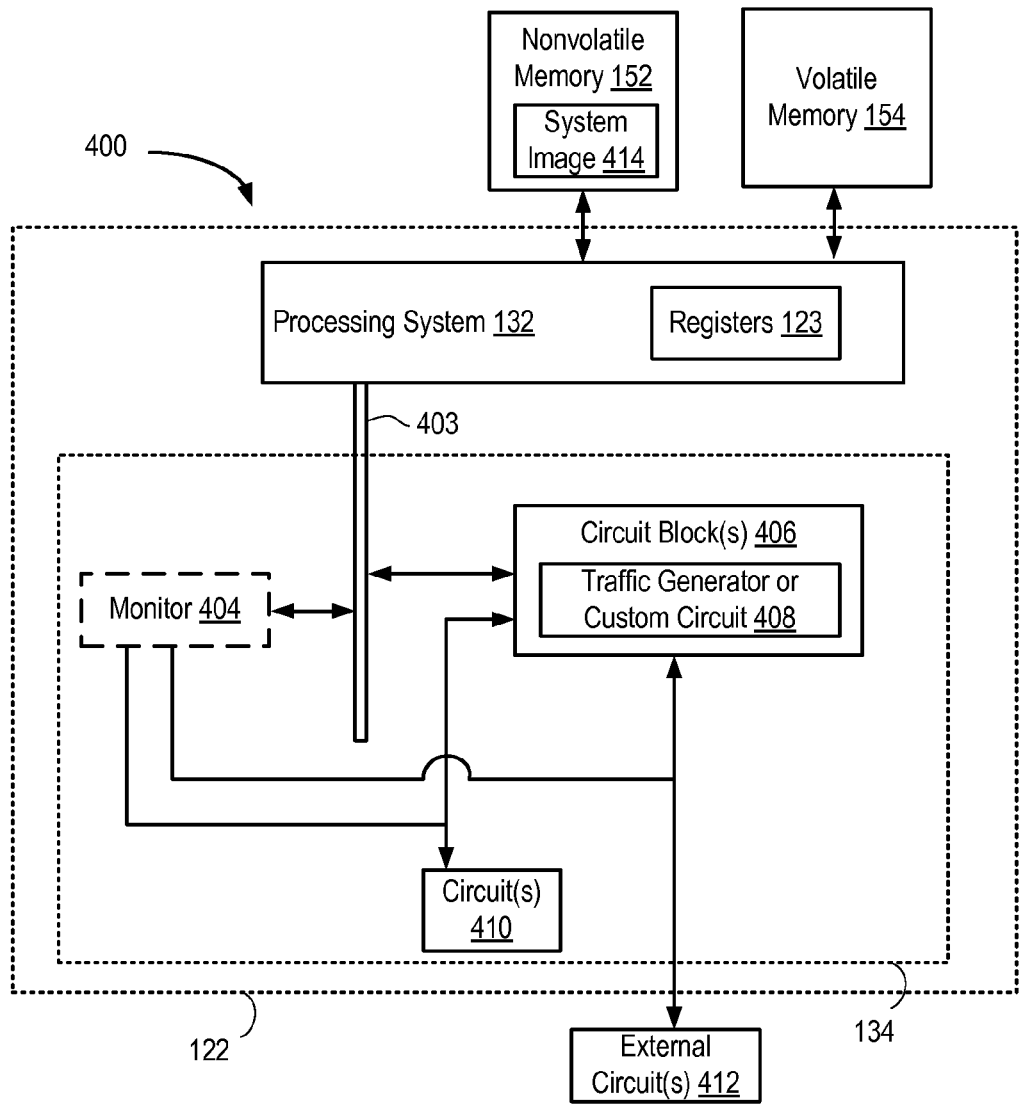
FIG. 4 is a block diagram depicting an example system implemented using a programmable SOC.

FIG. 4 is a block diagram depicting an example system 400 implemented using the programmable SOC 122. The nonvolatile memory 152 is loaded with a system image 414. The system image 414 includes configuration bitstream(s) for configuring the programmable SOC 122, as well as program code for execution by the processing system 132. The program code can include a first stage boot loader (FSBL), one or more other boot loader stages, an operating system, applications, and the like. The system 400 includes the processing system 132 having the registers 123 loaded with a particular parameter set. Some or all of the registers 123 can be set through execution of an FSBL. For example, the FSBL can be used to set the static register set and set initial values for the dynamic register set. Other program code can be used to modify the dynamic register set.

The programmable logic 134 is configured with one or more circuit blocks 406 coupled to a bus 403 of the processing system 132. The circuit block(s) 406 can be coupled to one or more other circuits 410 in the programmable logic 134. The circuit(s) 410 can include hardwired circuits (e.g., an MGT) and/or configured circuits. The circuit blocks 406 can be coupled to one or more external circuits 412. In some examples, the circuit block(s) 406 can be coupled to both the circuit(s) 410 and the external circuit(s) 412. In some examples, some circuit block(s) 406 are coupled to the circuit(s) 410, other circuit block(s) 406 are coupled to the external circuit(s) 412, other circuit block(s) 406 are coupled to both the circuit(s) 410 and the external circuit(s) 412, and/or other circuit block(s) 406 are not coupled to any other circuits. In some examples described below, the programmable logic 134 can also be configured with a monitor 404. The monitor 404 can be coupled to the bus 403, as well as the circuit(s) 410 and/or the external circuit(s) 412.

Returning to FIG. 3, the SPA component 312 provides for early exploration of hardware and software systems. A designer can use the SPM component 314 to perform complex performance modeling even before design work has started. The SPM component 314 can load a fixed configuration bitstream to the programmable SOC 122 that implements a predefined system design. The predefined system design includes one or more traffic generators configured in the programmable logic 134 and the monitor. The traffic generators are configurable cores that can model PL traffic activity. The monitor is configured to cooperate with the monitor framework 316 to monitor the overall performance of the system during test runs. To initiate the SPA process, the designer specifies a parameter set for the processing system 132 and the data traffic to be modeled. The designer can also specify program code to be executed.

The SPM component 314 generates a corresponding system image for the programmable system 150. The SPM component 314 can perform multiple test runs using the parameter settings and the traffic defined by the designer. The traffic generators perform the requested data traffic and the processing system 132 executes the requested software traffic or program code. The monitor framework 316 obtains data from the monitor during the test runs to observe overall performance of the system. In some examples, the designer may already have specified the hardware platform or portions of the hardware platform. The SPM component 314 can use custom circuit blocks defined by the designer, rather than the traffic generators, during the test runs.

A designer can interact directly with the hardware design tool 126 to specify the hardware platform of the system. However, as discussed above, this requires that the designer specify a parameter set for the registers 123 of the processing system 132, which can be a difficult task. A designer can also interact directly with the SDK design tool 128 to implement a predefined system for performance modeling and analysis. However, as discussed above, this also requires that the designer specify a parameter set for the registers 123 of the processing system 132 in order to initiate the test environment.

Accordingly, a designer can instead interact with the expert system tool 130. In an example, the designer can initiate the process without having a system design or without any knowledge of a particular parameter set for the processing system 132. Rather, the designer can interact with the user interface 302 to specify a description of performance objectives for the system. The performance objectives can be specified in different ways. Possible formats include desired throughput values (e.g., in megabytes per second), a desired latency (e.g., in cycles) for each communication channel, or the like, or a combination thereof. The user interface 302 then passes the description of the performance objectives to the backend 304. The backend 304 accesses the characterization database 305 using the performance objectives as query parameters.

The characterization database 305 relates parameter settings of the processing system 132 to performance under different traffic loads. In an example, characterization database 305 can be populated using test runs performed by the SPA component 312. The SPA component 312 can perform test runs as described above given different parameter sets and for different traffic settings. The monitor framework 316 collects the performance results, which are stored in the characterization database 305 in relation to the parameter settings and the traffic settings. The characterization database 305 can be pre-populated by distributor of the design tools 110. The characterization database 305 can also be populated by a designer through various test runs performed by the designer. Thus, the characterization database 305 can be initially populated by the distributor of the design tools 110, and updated and augmented over time through test runs by designer(s).

Given performance objectives specified by the designer, the backend 304 can query the characterization database 305 to obtain one or more parameter sets. If the designer did not specify traffic settings, the backend 304 can specify default traffic settings. Alternatively, the designer can also specify traffic settings through the user interface 302. In such case, the backend 304 can use both the designer-specified performance objectives and traffic settings to obtain a parameter set from the characterization database 305. The backend 304 then generates a parameter image for configuring the registers 123 of the processing system 132 based on the parameter set. The parameter image includes the values to be stored in the registers 123 to implement the selected parameter set.

The backend 304 can take various actions given the parameter image. In an example, the backend 304 can cooperate with the user interface 302 to display the register values encoded in the parameter image to the designer in a human-readable form. In another example, the backend 304 can output the parameter image in computer-readable form for use by other tools (e.g., the SDK design tool 128). In another example, the backend 304 can generate program code for configuring the registers 123 based on the parameter image. For example, the backend 304 can generate an FSBL that sets the values of the registers 123 based on the generated parameter image. In another example, the backend 304 can generate a system image for the programmable system 150 that includes an FSBL that sets the registers 123. The backend 304 can cooperate with other tools (e.g., the hardware design tool 126 and/or the SDK design tool 128) to generate the FSBL and/or system image. Alternatively, if the designer invokes the hardware design tool 126 and/or the SDK design tool 128 directly, the backend 304 can provide the parameter image for use in generating the FSBL and the system image.

In the example described above, the designer can be in the "pre-design" stage. In the pre-design stage, the designer may have knowledge of general system structure, performance objectives for such system, and potentially expected traffic patterns (e.g., either software traffic patterns or hardware traffic patterns between the processing system 132 and the programmable logic 134). The designer can use the expert system tool 130 to generate a parameter image. The SDK design tool 128 can be invoked (either manually by the designer or automatically by the expert system tool 130) to generate a predefined system using the SPA component 312. The SPA component 312 can take the parameter image generated by the expert system tool 130 as input. The designer can then verify the performance through the monitoring framework by executing one or more test runs.

Other use cases are possible. In another example, the designer can be in the "mid-design" stage. In the mid-design stage, the designer may already have an initial parameter set for the processing system 132 along with expected traffic patterns. In some cases, the designer may also have one or more known circuit modules that generate the traffic. The designer can specify this initial parameter set and the expected traffic patterns through the user interface 302. The backend 304 can query the characterization database 305 with the initial parameter set and the expected traffic patterns to obtain expected performance data. The backend 304 can report the expected performance data to the designer through the user interface 302 so that the designer. If the expected performance is satisfactory, the designer can then invoke the SPA component 312 to test the system given the initial parameter set and the expected traffic patterns. This allows the designer to verify the expected performance reported by the expert system tool 130 in the actual hardware. Should the actual performance differ, the backend 304 can update the performance data for the given parameter set in the characterization database 305.

In another example, the designer can be in a "late-design stage". The late-design stage is similar to the mid-design stage, but the designer may have designed the custom circuit(s) that generate the expected traffic. In such case, the expert system tool 130 can be invoked as described above with the mid-design stage. However, when the SPA component 312 implements the system, the SPA component 312 can use the designer's custom circuit(s) rather than the traffic generators.

As discussed above, the backend 304 can report expected performance data to the designer through the user interface 302 given an initial parameter set and expected traffic patterns. In addition to reporting the expected performance, the backend 304 can report suggested changes to the parameter set to achieve a more optimal performance. The backend 304 can perform various data analysis techniques to identify the suggested changes. In an example, the backend 304 can implement an unsupervised machine learning process to explore the performance space, such as k-means clustering. In such a process, the backend 304 can group the parameter sets in the characterization database 305 based on different attributes (e.g., a group of best performance for various traffic patterns, a group for lowest power consumption for various traffic patterns, etc.). The backend 304 can then determine deltas between the initial parameter set and the best performance, the lowest power consumption, etc. for the expected traffic patterns. The backend 304 can then suggest changes to the initial parameter set to the designer in order to achieve optimal performance, lowest power consumption, etc.

In another example, the backend 304 can implement a supervised machine learning process. In such a process, the backend 304 can designate specific performance sets in the characterization database 305 as being "best performance," "lowest power consumption," etc. for different traffic patterns. The backend 304 can determine deltas between the initial parameter set and the designated parameter sets for best performance, lowest power consumption, etc. for the expected traffic patterns. The backend 304 can then suggest changes to the initial parameter set to the designer in order to achieve optional performance, lower power consumption, etc.

The characterization database 305 can store data in various ways and using various relations. For example, the characterization database 305 can store raw performance results related to particular parameter sets and traffic patterns. Alternatively, the characterization database 305 can store equations relating performance and parameters for particular traffic patterns. In still another example, the characterization database can store a combination of raw performance data and equations from which performance data can be derived. Since there can be a large number of parameters, the search space for the characterization database 305 can be large. In some examples, the characterization database 305 can store performance data for key parameter sets and then interpolate performance results for other parameter sets. If the backend 304 reports interpolated performance data, the backend 304 can update the characterization database 305 with actual performance data after test runs executed by the SPA component 312.

Figure 5:
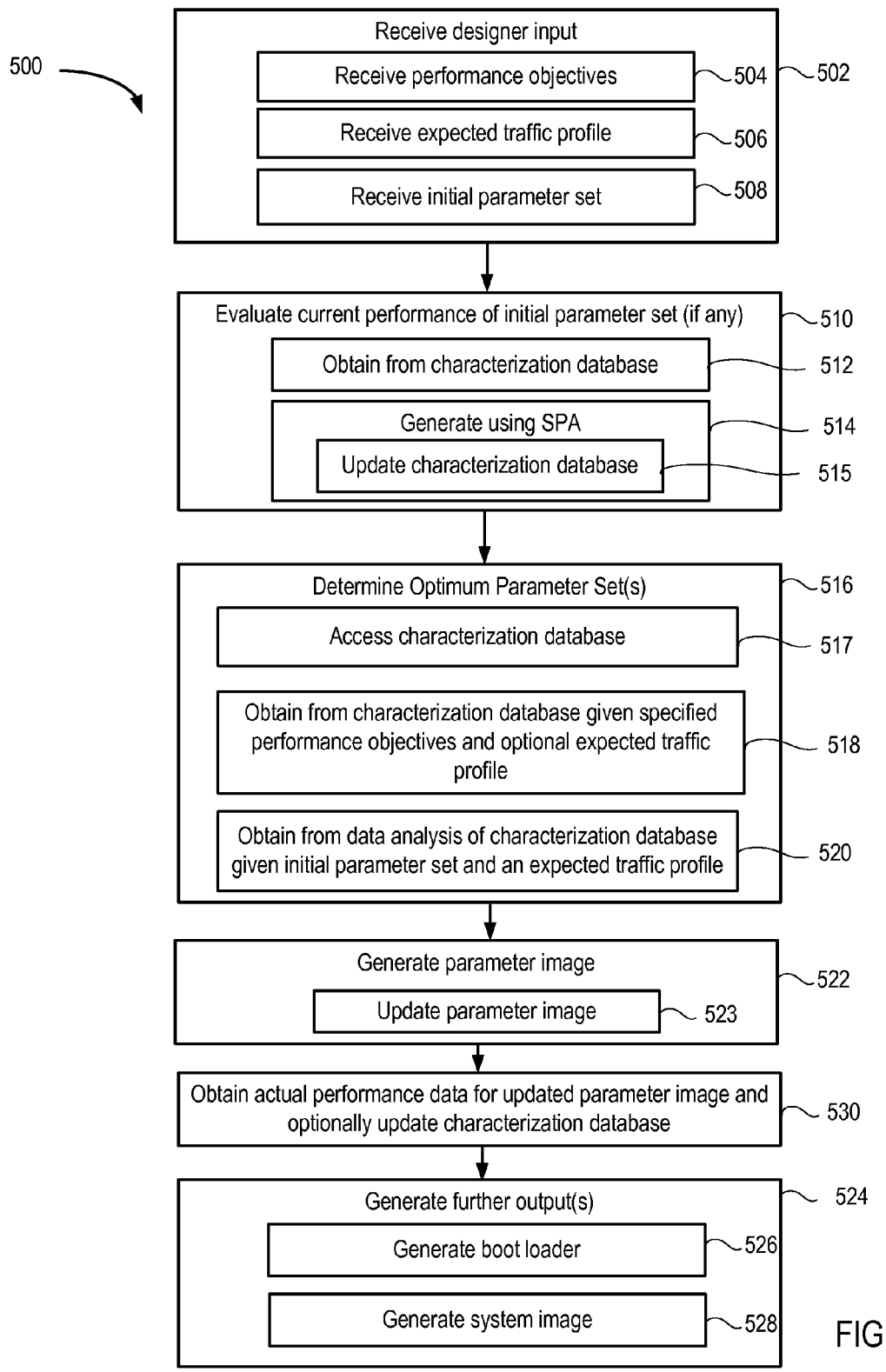
FIG. 5 is a flow diagram depicting a method of implementing a system design for a programmable SOC according to an example.

FIG. 5 is a flow diagram depicting a method 500 of implementing a system design for a programmable SOC according to an example. The method 500 can be performed by the design system 100 described above. The method 500 begins at step 502, wherein the expert system tool 130 receives input from a designer. The input can take different forms. In one example, the designer inputs a description of performance objectives. The performance objectives can be described in terms of throughput, latency, or the like. The performance objectives can be optional or required. Required performance objectives translate into performance constraints. In another example, in addition to the performance objectives, the designer specifies an expected traffic profile. The expected traffic profile includes one or more traffic patterns. A traffic pattern can be a software traffic pattern or a hardware traffic pattern. In another example, a designer can specify an initial parameter set for the processing system 132. Optionally, the designer can specify performance objectives and/or an expected traffic profile in addition to the initial parameter set.

At optional step 510, the expert system tool 130 evaluates current performance of an initial parameter set. The expert system tool 130 performs optional step 510 if the designer has specified an initial parameter set for the processing system 132. If the designer has not specified an initial parameter set (e.g., pre-design stage), then the expert system tool 130 does not perform optional step 510.

The expert system tool 130 can obtain current performance for an initial parameter set in different ways. At step 512, the expert system tool 130 can obtain performance data from the characterization database 305. For example, given the initial parameter set and an expected traffic profile, the expert system tool 130 can query the characterization database 305 to obtain performance data. As described above, the performance data can be raw performance data obtained from the characterization database, performance data derived from an equation, or performance data interpolated from other performance data. As an alternative to or in addition to step 512, at step 514, the expert system tool 130 can invoke the SDK design tool 128 to generate actual performance data using SPA. If actual performance data is generated, at step 515, the expert system tool 130 can update the characterization database 305 with the actual performance data.

At step 516, the expert system tool 130 determines optimum parameter set(s). In an example, the expert system tool 130, at step 517, accesses the characterization database 305. As described above, the characterization database 305 relates parameter settings of the processing system 132 to performance under difference traffic profiles as generated by an emulation system comprising the processing system 132 and one or more circuit blocks 406 implemented in programmable logic 134 (e.g., the system 400). At step 518, the expert system tool 130 obtains the optimum parameter set(s) from the characterization database 305 given the designer's performance objectives and optionally an expected traffic profile. As an alternative to or in addition to step 518, the expert system tool 130 can, at step 520, obtain optimum parameter set(s) from data analysis of the characterization database 305 given an initial parameter set and expected traffic profile. As described above, the expert system tool 130 can use techniques such as unsupervised machine learning, supervised machine learning, or the like to obtain or suggest an optimal parameter set based on the designer's initial parameter set and expected traffic profile.

At step 522, the expert system tool 130 generates a parameter image for the registers 123 of the processing system 132. The parameter image includes values for the registers 123 that implement a selected parameter set. The expert system tool 130 can generate a new parameter image if the designer did not provide an existing parameter set. If the designer provided an existing parameter set at step 508, then the expert system tool 130 can, at step 523, generate an updated parameter image that is a combination of the initial parameter set and the selected parameter set.

At optional step 530, the expert system tool 130 can invoke the SDK design tool 128 to generate actual performance data using SPA for the generated parameter image. If actual performance data is generated, the expert system tool 130 can update the characterization database 305 with the actual performance data.

At step 524, the expert system tool 130 optionally generates further output(s). In an example, at step 526, the expert system tool 130 can generate an FSBL based on the parameter image that sets the registers 123. In another example, at step 528, the expert system tool 130 can generate a system image for the programmable SOC 122 that includes a configuration bitstream, an FSBL to set the registers, and other program code (e.g., an operating system, applications, etc.).

Figure 6:
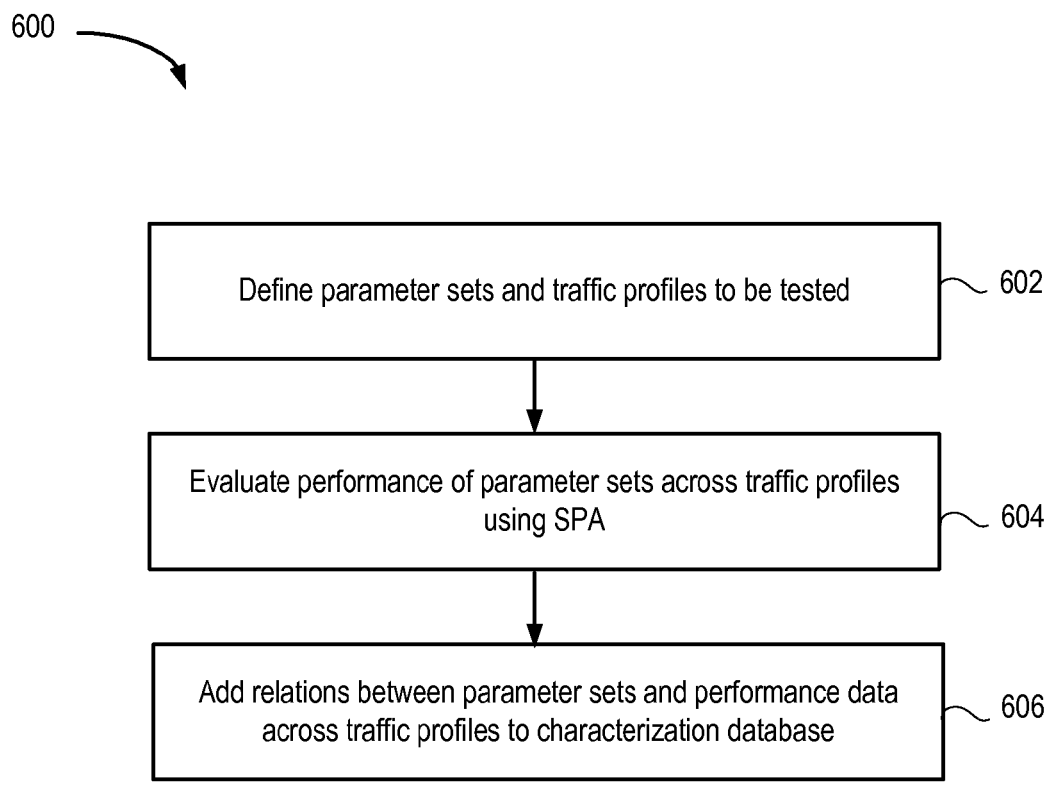
FIG. 6 is a flow diagram depicting a method of populating a characterization database according to an example.

FIG. 6 is a flow diagram depicting a method 600 of populating the characterization database 305 according to an example. The method 600 can be performed by the expert system tool 130 described above. At step 602, the expert system tool 130 receives defined parameter sets and traffic profiles to be tested. At step 604, the expert system tool 130 evaluates performance of a system design given the parameter sets across the traffic profiles using SPA. At step 606, the expert system tool 130 adds relations between parameter sets and performance data across the traffic profiles to the characterization database 305.

While the foregoing is directed to specific examples, other and further examples may be devised without departing from the basic scope thereof, and the scope thereof is determined by the claims that follow.

What is claimed is:

1. A method of implementing a system design of a programmable system-on-chip (SOC) having a processing system and programmable logic, the method comprising:
   receiving a description of performance objectives of the system design;
   accessing a characterization database that relates parameter settings of the processing system to performance under different traffic profiles generated by an emulation system comprising the processing system and one or more circuit blocks implemented in the programmable logic;
   obtaining a parameter set from the characterization database based on the description of the performance objectives; and
   generating a parameter image that encodes values of registers of the processing system based on the parameter set.

2. The method of claim 1, further comprising:
   generating a boot loader for the processing system based on the parameter image.

3. The method of claim 2, further comprising:
   generating a system image for the programmable SOC having the boot loader and a configuration bitstream.

4. The method of claim 1, wherein the description of the performance objectives includes at least one of a description of throughput or a description of latency.

5. The method of claim 1, further comprising:
   receiving an expected traffic profile for the system design;
   wherein the parameter set is obtained from the characterization database based on the description of the performance objectives and the expected traffic profile.

6. The method of claim 1, further comprising:
   obtaining actual performance data for the parameter set using the emulation system; and
   updating the characterization database based on the actual performance data.

7. The method of claim 1, wherein the parameter set is derived from an equation or interpolated from another parameter set.

8. A method of implementing a system design of a programmable system-on-chip (SOC) having a processing system and programmable logic, the method comprising:
  receiving an initial parameter set for the processing system and an expected traffic profile;
  accessing a characterization database that relates parameter settings of the processing system to performance under different traffic profiles generated by an emulation system comprising the processing system and one or more circuit blocks implemented in the programmable logic;
  obtaining performance data from the characterization database based on the initial parameter set and the expected traffic profile; and
  generating an updated parameter image that encodes values of registers of the processing system based on the performance data.

9. The method of claim 8, wherein the step of generating an updated parameter image comprises:
  determining an optimum parameter set from data analysis of the characterization database based on the initial parameter set and the expected traffic profile; and
  generating the updated parameter image based on the optimum parameter set.

10. The method of claim 8, further comprising:
  generating a boot loader for the processing system based on the updated parameter image.

11. The method of claim 10, further comprising:
  generating a system image for the programmable SOC having the boot loader and a configuration bitstream.

12. The method of claim 8, further comprising:
  obtaining actual performance data for the updated parameter set using the emulation system; and
  updating the characterization database based on the actual performance data.

13. The method of claim 8, wherein the performance data is derived from an equation or interpolated from other performance data.

14. A computer system, comprising:
  a memory storing program code; and
  a processor, coupled to the memory, configured to execute the program code to:
    receive a description of performance objectives of the system design;
    access a characterization database that relates parameter settings of the processing system to performance under different traffic profiles generated by an emulation system comprising the processing system and one or more circuit blocks implemented in the programmable logic;
    obtain a parameter set from the characterization database based on the description of the performance objectives; and
    generate a parameter image that encodes values of registers of the processing system based on the parameter set.

15. The computer system of claim 14, wherein the processor is further configured to execute the program code to:
  generate a boot loader for the processing system based on the parameter image.

16. The computer system of claim 15, wherein the processor is further configured to execute the program code to:
  generate a system image for the programmable SOC having the boot loader and a configuration bitstream.

17. The computer system of claim 14, wherein the description of the performance objectives includes at least one of a description of throughput or a description of latency.

18. The computer system of claim 14, wherein the processor is further configured to execute the program code to:
  receive an expected traffic profile for the system design;
  wherein the parameter set is obtained from the characterization database based on the description of the performance objectives and the expected traffic profile.

19. The computer system of claim 14, wherein the processor is further configured to execute the program code to:
  obtain actual performance data for the parameter set using the emulation system; and
  update the characterization database based on the actual performance data.

20. The computer system of claim 14, wherein the parameter set is derived from an equation or interpolated from another parameter set.

* * * * *